United States Patent
Saga et al.

(10) Patent No.: US 9,090,751 B2
(45) Date of Patent: Jul. 28, 2015

(54) THERMALLY CONDUCTIVE THERMOPLASTIC RESIN COMPOSITIONS AND RELATED APPLICATIONS

(75) Inventors: Yuji Saga, Utsunomiya (JP); Narumi Une, Utsunomiya (JP)

(73) Assignee: Ticona LLC, Florence, KY (US)

( * ) Notice: Subject to any disclaimer, the term of this patent is extended or adjusted under 35 U.S.C. 154(b) by 217 days.

(21) Appl. No.: 13/383,469

(22) PCT Filed: Jul. 21, 2010

(86) PCT No.: PCT/IB2010/053331
§ 371 (c)(1),
(2), (4) Date: Aug. 1, 2012

(87) PCT Pub. No.: WO2011/010290
PCT Pub. Date: Jan. 27, 2011

(65) Prior Publication Data
US 2013/0003416 A1    Jan. 3, 2013

Related U.S. Application Data

(60) Provisional application No. 61/228,166, filed on Jul. 24, 2009.

(51) Int. Cl.
*C08K 3/00* (2006.01)
*C08K 7/04* (2006.01)
*C09K 19/02* (2006.01)
*C09K 19/38* (2006.01)
*C09K 19/52* (2006.01)
*H05K 7/20* (2006.01)

(52) U.S. Cl.
CPC .............. *C08K 3/0008* (2013.01); *C08K 7/04* (2013.01); *C09K 19/02* (2013.01); *C09K 19/3809* (2013.01); *C09K 19/52* (2013.01); *H05K 7/20481* (2013.01)

(58) Field of Classification Search
CPC .... C08K 3/0008; C08K 7/04; H05K 7/20481; C09K 19/02; C09K 19/52; C09K 19/3809
USPC .............. 252/299.01, 511, 519.33; 428/1.1; 524/433, 436
See application file for complete search history.

(56) References Cited

U.S. PATENT DOCUMENTS

| | | |
|---|---|---|
| 3,315,308 A | 4/1967 | Wiley et al. |
| 3,777,099 A | 12/1973 | Levinson |
| 4,118,372 A | 10/1978 | Schaefgen |
| 4,174,358 A | 11/1979 | Epstein |
| 4,265,968 A | 5/1981 | Prewo |
| 4,266,108 A | 5/1981 | Anderon et al. |
| 4,362,917 A | 12/1982 | Freedmand et al. |
| 4,425,368 A | 1/1984 | Watkins |
| 4,454,403 A | 6/1984 | Teich et al. |
| 4,503,168 A | 3/1985 | Hartsing, Jr. |
| 4,518,651 A | 5/1985 | Wolfe, Jr. |
| 4,541,411 A | 9/1985 | Woolf |
| 4,542,271 A | 9/1985 | Tanonis et al. |
| 4,563,488 A | 1/1986 | Minami et al. |
| 4,585,823 A | 4/1986 | Saito et al. |
| 4,626,557 A | 12/1986 | Duska et al. |
| 4,649,448 A | 3/1987 | Nakajima |
| 4,714,734 A | 12/1987 | Hashimoto et al. |
| 4,728,762 A | 3/1988 | Roth et al. |
| 4,851,632 A | 7/1989 | Kaliski |
| 4,922,811 A | 5/1990 | Stumpf |
| 4,933,526 A | 6/1990 | Fisher et al. |
| 4,959,516 A | 9/1990 | Tighe et al. |
| 5,021,293 A | 6/1991 | Huang et al. |
| 5,028,461 A | 7/1991 | Nakamichi |
| 5,049,714 A | 9/1991 | Beresniewicz et al. |
| 5,057,659 A | 10/1991 | Schneider et al. |
| 5,130,342 A | 7/1992 | McAllister et al. |
| 5,141,985 A | 8/1992 | Asai et al. |
| 5,183,643 A | 2/1993 | Nichols |
| 5,229,563 A | 7/1993 | Isogai et al. |
| 5,268,546 A | 12/1993 | Berg |
| 5,308,913 A | 5/1994 | Asai et al. |
| 5,428,100 A | 6/1995 | Asai et al. |
| 5,486,683 A | 1/1996 | Shimizu et al. |

(Continued)

FOREIGN PATENT DOCUMENTS

| | | |
|---|---|---|
| EP | 0 478 082 A1 | 4/1992 |
| EP | 0 494 422 A2 | 7/1992 |

(Continued)

OTHER PUBLICATIONS

Abstract and Machine Translation of JP2001-115057 dated Apr. 24, 2001, 14 pages.
Abstract JP2003-034523, Feb. 7, 2003, 1 page.
Abstract and Machine Translation of JP2004-175812 dated Jun. 24, 2004, 53 pages.
Abstract and Machine Translation of JP2006-282783 dated Oct. 19, 2006, 17 pages.

(Continued)

*Primary Examiner* — Geraldina Visconti
(74) *Attorney, Agent, or Firm* — Dority & Manning, P.A.

(57) ABSTRACT

Thermally conductive thermoplastic resin compositions are provided containing thermoplastic resin and thermally conductive filler and fibrous filler, along with articles made therefrom. In certain instances when the thermally conductive filler and fibrous filer are more restricted, and other ingredients are present, the thermally conductive composition exhibits an improved volume resistibility and is suitable for fabricating a chassis for LCD display. Also described are the thermally conductive resin compositions, especially when the polymer is LCP. Such compositions are useful for items such as electrical and electronic housings requiring highly thermally conduciveness.

15 Claims, 2 Drawing Sheets

(56) References Cited

U.S. PATENT DOCUMENTS

| | | |
|---|---|---|
| 5,529,716 A | 6/1996 | Nomura et al. |
| 5,665,819 A | 9/1997 | Tenzer |
| 5,677,253 A | 10/1997 | Inoue et al. |
| 5,976,406 A | 11/1999 | Nagano et al. |
| 6,077,454 A | 6/2000 | Tenzer |
| 6,146,764 A | 11/2000 | Suokas et al. |
| 6,326,599 B1 | 12/2001 | Pickford |
| 6,346,568 B1 | 2/2002 | Maeda et al. |
| 6,487,073 B2 | 11/2002 | McCullough et al. |
| 6,495,616 B2 | 12/2002 | Maeda |
| 6,641,878 B2 | 11/2003 | Suzuki et al. |
| 6,702,956 B2 | 3/2004 | Maeda et al. |
| 6,758,989 B2 | 7/2004 | Miyashita et al. |
| 6,815,486 B2 | 11/2004 | Bhagwagar et al. |
| 6,830,769 B2 | 12/2004 | Meroni |
| 6,871,351 B2 | 3/2005 | Yamauchi et al. |
| 6,919,111 B2 | 7/2005 | Swoboda et al. |
| 6,939,477 B2 | 9/2005 | Stark et al. |
| 6,989,194 B2 | 1/2006 | Bansal et al. |
| 7,790,786 B2 | 9/2010 | Murouchi et al. |
| 8,097,481 B2 | 1/2012 | Imer et al. |
| 8,119,176 B2 | 2/2012 | Moons |
| 8,269,154 B2 | 9/2012 | Samuels et al. |
| 8,491,813 B2 | 7/2013 | Moons |
| 2005/0176835 A1 | 8/2005 | Kobayashi et al. |
| 2006/0014876 A1 | 1/2006 | Bushelman et al. |
| 2006/0237451 A1 | 10/2006 | Samuels et al. |
| 2009/0162538 A1 | 6/2009 | Boehm et al. |
| 2013/0062556 A1* | 3/2013 | Saga ............................ 252/75 |

FOREIGN PATENT DOCUMENTS

| | | | |
|---|---|---|---|
| EP | 0 494 422 A3 | 7/1992 | |
| EP | 0 846 419 A1 | 6/1998 | |
| JP | 2008133382 A * | 6/2008 | |
| JP | WO 2008/066051 A1 * | 6/2008 | .................... 252/74 |
| JP | 2009007552 A * | 1/2009 | |
| WO | WO 9405728 A1 | 3/1994 | |
| WO | WO 0134702 A2 | 5/2001 | |
| WO | WO 0134702 A3 | 5/2001 | |
| WO | WO 2004011539 A2 | 2/2004 | |
| WO | WO 2004011539 A3 | 2/2004 | |
| WO | WO 2006057458 A1 | 6/2006 | |
| WO | WO 2011010290 A1 | 1/2011 | |

OTHER PUBLICATIONS

Abstract of JP2008-184540, Aug. 14, 2008, 1 page.
Abstract of WO2007/135749, Nov. 29, 2007, 1 page.
Abstract of Japanese Patent No. JPS61181847, Aug. 14, 1986—Thermally Conductive Resin Composition and Thermally Conductive Molding.
Abstract of Japanese Patent No. JPH0967446, Mar. 11, 1997, 2 pages—Continuous Production of Molecular Composite Material Comprising Liquid Crystalline Polymer and Thermoplastic Polymer.
Abstract of Japanese Patent No. JP2006282783, Oct. 19, 2006, 1 page—Highly Heat-Conductive Resin Composition.
Abstract and Machine Translation of JP2008133382, Jun. 12, 2008, 10 pages—Heat-Conductive Resin Composition.
Abstract and Machine Translation of JP2009007552, Jan. 15, 2009, 15 pages—Therm0plastic Resin Composition for Light-Emitting Element, Molding Made Therefrom, and Light-Emitting Element Using the Same.
Abstract of WO0134720, May 17, 2001, 1 page.
Abstract of WO2005033216, Apr. 14, 2005, 1 page.
Article—Olofa et al., Thermal Conductivity of the Ferrites $Ni_{0.65}Zn_{0.35}Cu_xFe_{2-x}O_4$, *Journal of Thermal Analysis*, vol. 37, 1991, pp. 2277-2284.
Article—Touloukian, et al., "Thermal Conductivity Nonmetallic Solids," *Thermophysical Properties of Matter*, vol. 2, Dec. 1970, pp. 295-300.
Chapter 3: Japan's Near-Term Optical Storage Roadmap, Feb. 1996, 8 pages.
Nippon Steel Technical Report No. 84, Jul. 2001, "Pitch-Based Carbon Fiber with Low Modulus and High Heat Conduction".
Search Report and Written Opinion for PCT/IB2010/053331, Oct. 8, 2010, 10 pages.

* cited by examiner

THERMALLY CONDUCTIVE THERMOPLASTIC RESIN COMPOSITIONS AND RELATED APPLICATIONS

CROSS REFERENCE TO RELATED APPLICATION

This application is the national stage entry of International Patent Application No. PCT/IB2010/05331 having a filing date of Jul. 21, 2010, which claims filing benefit of U.S. Provisional Application Ser. No. 61/228,166 having a filing date of Jul. 24, 2009, which are incorporated herein in their entirety.

FIELD OF THE INVENTION

The present invention relates to thermally conductive thermoplastic resin compositions and articles made therefrom. In particular, the present invention relates to a chassis structure for electrical and electronic devices wherein a light source is constructed inside and wherein heat is generated in the light source so as to be dissipated to an ambient atmosphere, which is formed from thermally conductive thermoplastic resin compositions comprising thermoplastic polymer and calcium fluoride, and, optionally, one or more of fibrous filler, liquid crystalline polymer, and polymeric toughening agent. This invention also relates to the thermoplastic resin composition comprising liquid crystalline polymer, such that volume resistivity of the composition of the present invention is increased resulting into enabling to make highly thermally conductive articles, compared with typical of compositions that have been proposed.

BACKGROUND OF THE INVENTION

Many electrical and electronic devices such as a light emitting package in a structure such as a mold frame, a chassis structure or a metal bottom cover. These can be used as a light source for a backlight unit of an LCD or as a light unit in an illumination field backlight unit. In general, there are edge-type backlight units and direct-type backlight units, depending on the position of a light source. Because of their excellent mechanical and electrical insulation properties, thermoplastic polymeric resin compositions are used to manufacture articles of various sizes and shapes, including without limitation chassis components, and housings. In many cases, because of the design flexibility and their low cost, polymer resin compositions have replaced metal in these applications. However, many of these applications require that the parts be in the vicinity of or in contact with heat sources such as electrical lights. It is therefore desirable to form these parts from materials that are sufficiently thermally conductive to dissipate the heat generated. While metal parts thermally conductive, they are also often electrically conductive, which can be undesirable in certain applications.

Thermoplastic resin compositions are generally thermally insulating and typically electrically insulating unless they contain large amounts of electrically conductive additives. Thus, a thermally conductive, electrically insulating thermoplastic resin composition would be desirable and could replace metals, and in particular, aluminum, in many applications.

U.S. Pat. No. 6,487,073 describes a case for dissipating heat from an electronic device, comprising a housing of a net-shaped moldable thermally conductive composite material of a polymer base matrix with thermally conductive filler, and in thermal communication with an electronic component with heat dissipating from a heat generating electronic component and therethrough. No mention is made of using particular thermal conductive fillers with thermoplastic polymer.

SUMMARY OF THE INVENTION

Compositions according to this invention comprise (a) about (15) to about (75) weight percent of at least one thermoplastic polymer selected from the group consisting of thermoplastic polyesters, polyamides, polyacetals, polycarbonates, polyphenylene oxides, polyphenylene sulfides, polysulphones, liquid crystal polymers such as aromatic polyesters, polyarylates, polyetheretherketones, polyetherketoneketones, and syndiotactic polystyrenes; (b) about (25) to about (85) weight percent of thermally conducting filler having a thermal conductivity of at least 5 W/mK; and, (c) (0) to about (30) weight percent of at least one fibrous filler having a thermal conductivity of at most 5 W/mK; the above stated percentages being based on the total weight of the composition.

Also included are molded articles comprising compositions of this invention, including applications in electronic and electrical apparatus including a chassis structure for electrical and electronic devices wherein a light source is constructed inside and wherein heat is generated in the light source so as to be dissipated to an ambient atmosphere, and having improved thermal conductivity properties, made from thermally conductive thermoplastic resin compositions. Preferred applications involve the light emitting package used as a light source for a backlight unit of an LCD or as a light unit in an illumination field backlight unit. Other aspects and embodiments of this invention will be better understood in view of the following detailed description of preferred embodiments.

There is also disclosed and claimed herein a composition comprising liquid crystalline polymer, in an amount between about 15 and about 75 weight percent of the composition; thermally conductive filler having a thermal conductivity of at least 5 W/mK, in an amount between about 25 and about 85 weight percent of the composition; and at least one fibrous filler having a thermal conductivity of at most 5 W/mK, In an amount between about 0 and about 30 weight percent of the composition,
wherein the thermally conductive filler is at least one selected from the group consisting of calcium fluoride, magnesium oxide, magnesium carbonate, boehmite and zinc sulfide, and the composition has a volume resistivity that is larger than $1 \times 10^{10}$ ohm·cm.

DETAILED DESCRIPTION OF DRAWINGS

FIG. 1A is an exploded view of the light emitting package for a backlight unit (Edge Light Type)

FIG. 1B is a perspective view of the light emitting package for a backlight unit (Edge Light Type)

FIG. 1C is a cross-sectional view of the light emitting package for a backlight unit (Direct Light Type) of FIG. 1B taken along line 1C FIG. 1D is an exploded view of the light emitting package for a backlight unit (Direct Light Type)

FIG. 1E is a perspective view of the light emitting package for a backlight unit (Direct Light Type)

FIG. 1F is a cross-sectional view of the light emitting package for a backlight unit (Direct Light Type) of FIG. 1E taken along the line 1F

DETAILED DESCRIPTION OF THE INVENTION

This invention includes compositions comprising at least one thermoplastic polymer selected from the group consisting of thermoplastic polyesters, polyamides, polyacetals, polycarbonates, polyphenylene oxides, polyphenylene sulfides, polysulphones, liquid crystal polymers such as aromatic polyesters, polyarylates, polyetheretherketones, polyetherketoneketones, and syndiotactic polystyrenes; thermally conductive filler having a thermal conductivity of at least 5 W/mK; the above stated percentages being based on the total weight of the composition. Also included are molded articles comprising compositions of this invention, including applications in electronic and electrical apparatus including a chassis structure for electrical and electronic devices wherein a light source is constructed inside and wherein heat is generated in the light source so as to be dissipated to an ambient atmosphere, and having improved thermal conductivity properties, made from thermally conductive thermoplastic resin compositions. Preferred applications involve the light emitting package used as a light source for a backlight unit of an LCD or as a light unit in an illumination field backlight unit.

Having reference to the figures herein, FIG. 1 illustrates a chassis structure of the light source package of similar construction; FIGS. 1A and 1B and 1C show the edge light type of backlight unit; and FIGS. 1D and 1E and 1F show the direct light type of backlight unit.

The figures are provided by way of example and are not intended to limit the invention. Skilled artisans appreciate that objects in the figures are illustrated for simplicity and clarity and have not necessarily been drawn to scale. For example, the dimensions of some of the objects in the figures may be exaggerated relative to other objects to help to improve understanding of embodiments.

Figure 1A:
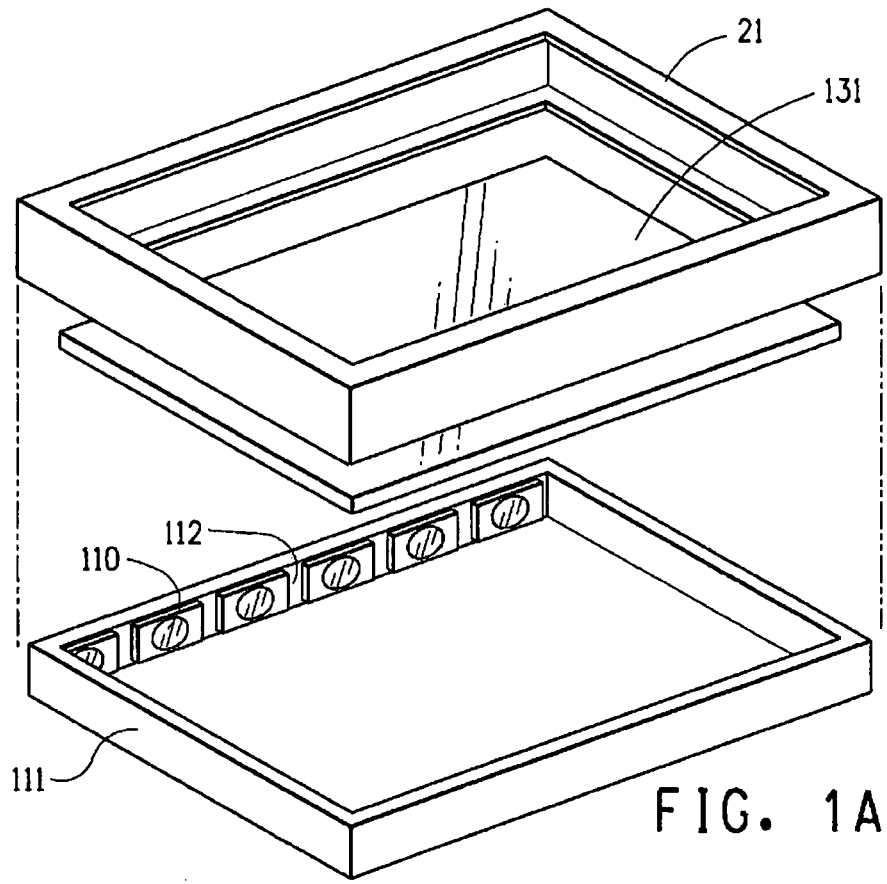
FIGS. 1A-1F are various perspective and cross-sectional views of a chassis structure including a light emitting package for a backlight unit of the present invention.
Figure 1B:
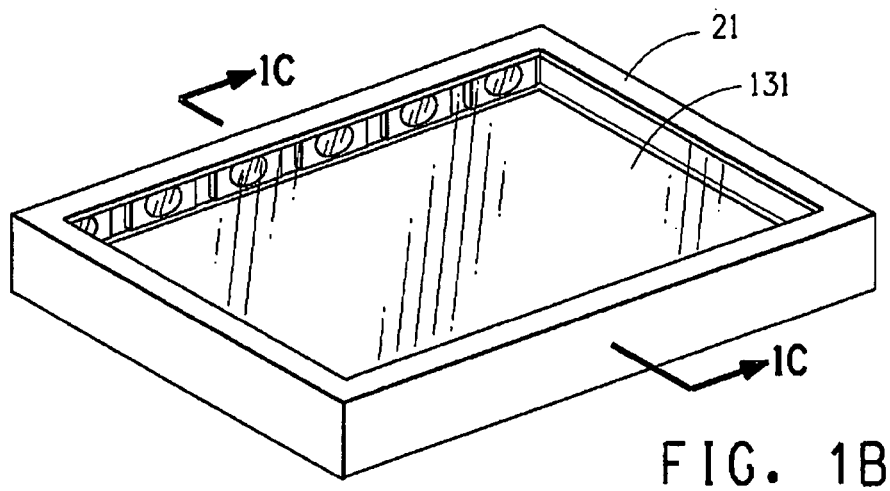
Figure 1C:
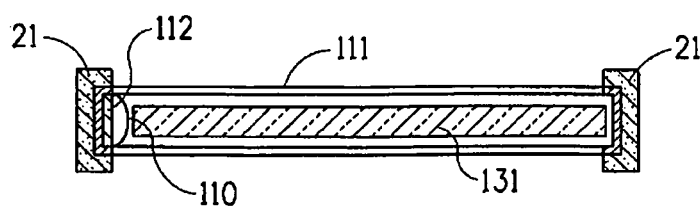
Figure 1D:
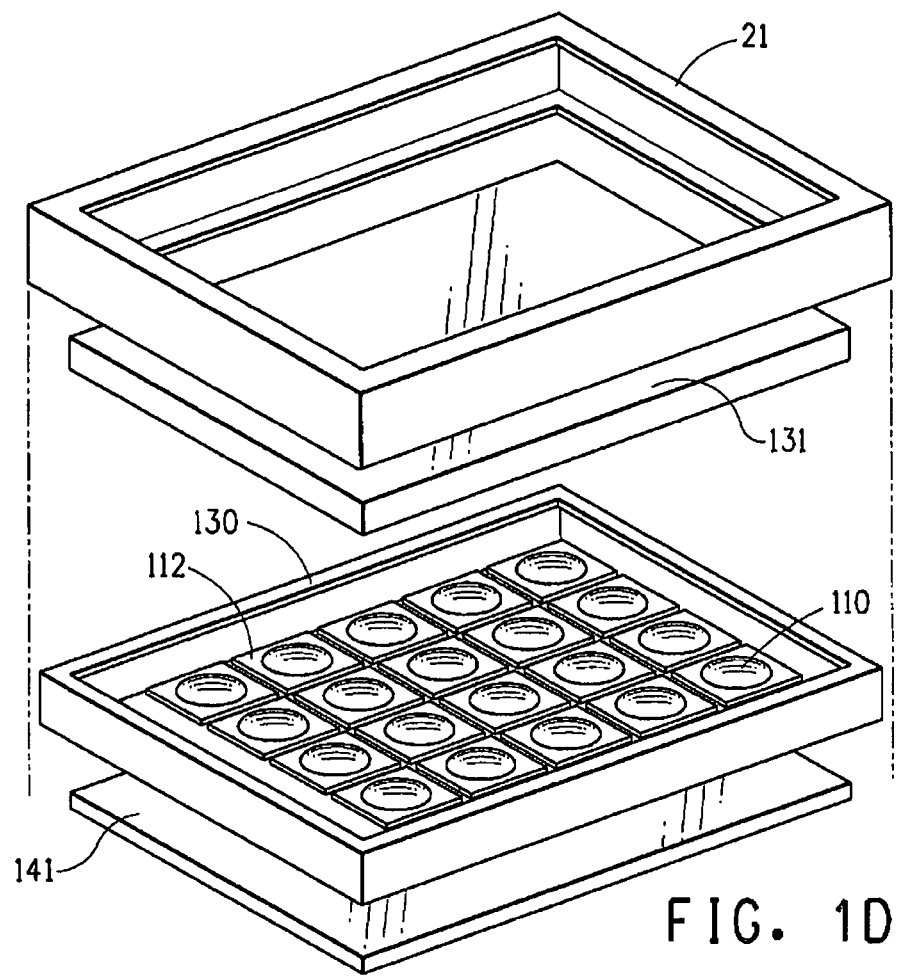
Figure 1E:
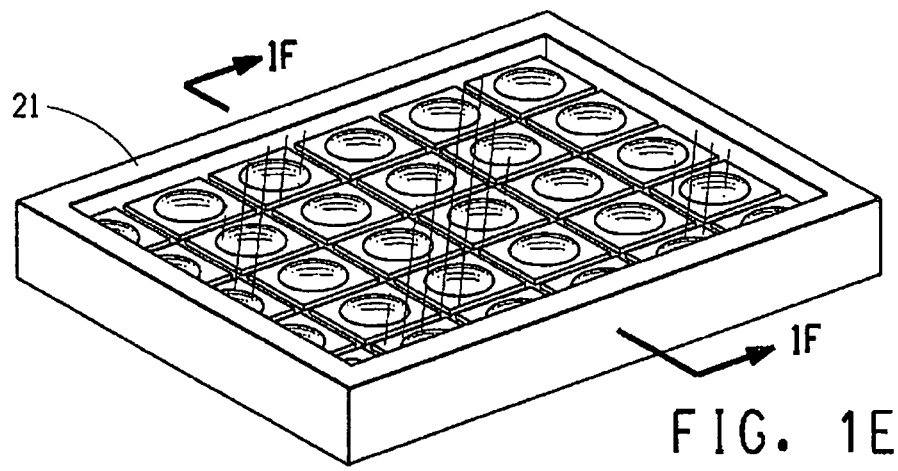
Figure 1F:
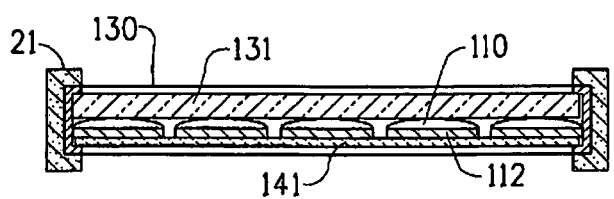

Referring to FIG. 1A-C, there is shown an edge-type backlight unit featuring a mold frame 21 and a metal chassis 111. Also shown are a light emitting unit (lamp) 110 and circuit board 112. The assembly includes a diffuser plate 131. Referring to FIG. 1D-F there is shown a direct-type backlight unit which incorporates many of the same features as the edge-type backlight unit although with a different layout. Most notably the light emitting unit 110 in FIG. 1D-F is positioned in a different orientation versus the edge-type backlight units of FIG. 1A-C. In addition, the direct-type backlight units feature a reflecting plate 141; and, metal chassis 130 is shown instead of previous metal chassis 111.

The light source package (such as the backlight assembly) comprises a light emitting unit (lamp) 110, a light guide plate, a diffuser plate 131 and a reflecting plate 141 which are respectively shown in FIGS. 1B and 1D. The light emitting unit 110 comprises a printed circuit board 112 and a lamp (such as an LED). The light emitting unit 110 comprises a plurality of LEDs mounted on the edge of metal chassis 111 as shown in FIGS. 1A and 1C (or metal chassis 130 as shown in FIGS. 1D and 1F), the rear surface of the circuit board of the light emitting unit (not shown) while being electrically connected with a main substrate (not shown). Although not illustrated, the light guide plate receives light from the light emitting unit (lamp) 110 to uniformly distribute the light over the whole light emitting area of a backlight. As shown in FIG. 1B, the diffuser plate 131 is attached to the light guide plate and selectively comprises a lens sheet, a diffusion sheet, a protective sheet and the like. As shown in FIG. 1D, the reflecting plate 141 is attached to the bottom surface of the light guide plate to reflect light, which is leaked through the bottom surface of the light guide plate, to the light emitting area. The liquid crystal panel (LCD) and the backlight assembly must be received and fixed. The receiving device comprises the mold frame 21 and the metal chassis 111 or 130, which is typically referred to as a chassis structure. The mold frame 21 has a shape corresponding to the external appearance of the liquid crystal panel and the backlight assembly such that the liquid crystal panel and the backlight assembly can be received in the mold frame 21. The mold frame 21, for example, comprises four frames. For example, the mold frame 21 may comprise synthetic resin such as polycarbonate resin, styrene resin, polyvinyl chloride or polypropylene. A lamp receiving section can be formed inside the mold frame 21 to receive the light emitting unit (lamp) 110. The metal chassis 111 or 130 is coupled with the outer end surface of the mold frame 21 to reinforce the strength of the mold frame 21. The frames 21 surround the metal chassis 111 or 130 as shown in FIGS. 1A and 1C and in FIGS. 1D and 1F. The chassis, for example, comprises four frames. The chassis may comprise metal material. For example, chassis may comprise at least one of stainless steel, iron, aluminum, an aluminum alloy and copper. For dissipating heat emitted from the light source (lamp) 110, a dissipate method of heat generated in the LED 110 depending on a mount type of the LED can be selectively determined.

The chassis structures herein comprise a light emitting unit (lamp) 110 for generating light, a first metal chassis 111 or 130 being connected to the light emitting unit (lamp) 110, a second member (the mold frame 21) covering the first metal chassis 111 or 130 and in thermal contact with the first metal chassis 111 or 130 for dissipating heat emitted from the light emitting unit (lamp) 110 to an ambient atmosphere, the mold frame 21 being formed of a composition that comprises (a) at least one thermoplastic polymer, (b) thermally conductive filler having thermal conductivity of at least 5 W/mK, (c) at least one fibrous filler having a thermal conductivity of at most 5 W/mK, optionally (e) at least one polymeric toughening agent, and (e) additional additives.

The Thermoplastic Polymer (a)

Mixtures of thermoplastic polymers and/or thermoplastic copolymers may be used in selecting component (a) of the compositions herein. Examples of thermoplastic polymers include polyesters, polyamides, polyacetals, polycarbonates, polyphenylene oxides, polyphenylene sulfides, polysulphones, liquid crystal polymers such as aromatic polyesters, polyarylates, polyetheretherketones (PEEK), polyetherketoneketones (PEKK), and syndiotactic polystyrenes. Preferred thermoplastic polymers are polyesters, polyamides, and liquid crystal polymers such as aromatic polyesters, More preferred thermoplastic polymers are liquid crystal polymers (LCPs) such as aromatic polyesters because of their higher stiffness, better moldability, and flame retardancy that are important requirements of frame materials in this application.

Preferred thermoplastic polyesters include polyesters having an inherent viscosity of 0.3 or greater and that are, in general, linear saturated condensation products of diols and dicarboxylic acids, or reactive derivatives thereof. Preferably, they will comprise condensation products of aromatic dicarboxylic acids having 8 to 14 carbon atoms and at least one diol selected from the group consisting of neopentyl glycol, cyclohexanedimethanol, 2,2-dimethyl-1,3-propane diol and aliphatic glycols of the formula $HO(CH_2)_nOH$ where n is an integer of 2 to 10. Up to 20 mole percent of the diol may be an aromatic diol such as ethoxylated bisphenol A, sold under the tradename Dianol 220 by Akzo Nobel Chemicals, Inc.; hydroquinone; biphenol; or bisphenol A. Up to 50 mole percent of the aromatic dicarboxylic acids can be replaced by at least one different aromatic dicarboxylic acid having from 8 to 14 carbon atoms, and/or up to 20 mole percent can be replaced by an aliphatic dicarboxylic acid having from 2 to 12 carbon atoms. Copolymers may be prepared from two or more diols or reactive equivalents thereof and at least one dicarboxylic acid or reactive equivalent thereof or two or more dicarboxylic acids or reactive equivalents thereof and at least one diol or reactive equivalent thereof. Difunctional hydroxy acid monomers such as hydroxybenzoic acid or hydroxynaphthoic acid or their reactive equivalents may also be used as comonomers.

Preferred polyesters include poly(ethylene terephthalate) (PET), poly(1,4-butylen terephthalate) (PBT), poly(propylene terephthalate) (PPT), poly(1,4-butylen naphthalate) (PBN), poly(ethylene naphthalate) (PEN), poly(1,4-cyclohexylene dimethylene terephthalate) (PCT), and copolymers and mixtures of the foregoing. Also preferred are 1,4-cyclohexylene dimethylene terephthalate/isophthalate copolymer and other linear homopolymer esters derived from aromatic dicarboxylic acids, including isophthalic acid; bibenzoic acid; naphthalenedicarboxylic acids including the 1,5-; 2,6-; and 2,7-naphthalenedicarboxylic acids; 4,4'-diphenylenedicarboxylic acid; bis(p-carboxyphenyl)methane; ethylenebis-p-benzoic acid; 1,4-tetramethylene bis(p-oxybenzoic) acid; ethylene bis(p-oxybenzoic) acid; 1,3-trimethylene bis(p-oxybenzoic)acid; and 1,4-tetramethylene bis(p-oxybenzoic)acid, and glycols selected from the group consisting of 2,2-dimethyl-1,3-propane diol; neopentyl glycol; cyclohexane dimethanol; and aliphatic glycols of the general formula HO(CH2) nOH where n is an integer from 2 to 10, e.g., ethylene glycol; 1,3-trimethylene glycol; 1,4-tetramethylene glycol; -1,6-hexamethylene glycol; 1,8-octamethylene glycol; 1,10-decamethylene glycol; 1,3-propylene glycol; and 1,4-butylene glycol. Up to 20 mole percent, as indicated above, of one or more aliphatic acids, including adipic, sebacic, azelaic, dodecanedioic acid or 1,4-cyclohexanedicarboxylic acid can be present.

Also preferred are copolymers derived from 1,4-butanediol, ethoxylated bisphenol A, and terephthalic acid or reactive equivalents thereof. Also preferred are random copolymers of at least two of PET, PBT, and PPT, and mixtures of at least two of PET, PBT, and PPT, and mixtures of any of the foregoing.

The thermoplastic polyester may also be in the form of copolymers that contain poly (alkylene oxide) soft segments. The poly(alkylene oxide) segments are to be present in about 1 to about 15 parts by weight per 100 parts per weight of thermoplastic polyester. The poly(alkylene oxide) segments have a number average molecular weight in the range of about 200 to about 3,250 or, preferably, in the range of about 600 to about 1,500. Preferred copolymers contain poly(ethylene oxide) incorporated into a PET or PBT chain. Methods of incorporation are known to those skilled in the art and can include using the poly(alkylene oxide) soft segment as a comonomer during the polymerization reaction to form the polyester. PET may be blended with copolymers of PBT and at least one poly(alkylen oxide). A poly(alkyene oxide) may also be blended with a PET/PBT copolymer. The inclusion of a poly(alkylen oxide) soft segment into the polyester portion of the composition may accelerate the rate of crystallization of the polyester.

Preferred polyamides include polyamide 6, polyamide 66, polyamide 612, polyamide 610, or other aliphatic polyamides and semi-aromatic polyamides, such as those derived from terephthalic acid and/or isophthalic acid. Examples include polyamides 9T; 10T; 12T; polyamides derived from hexamethylenediamine, adipic acid, and terephthalic acid; and polyamides derived from hexamethylenediamine, 2-methylpentamethylenediamine, and terephthalic acid. Blends of two or more polyamides may be used.

Polyacetals can be either one or more homopolymers, copolymers, or a mixture thereof. Homopolymers are prepared by polymerizing formaldehyde or formaldehyde equivalents, such as cyclic oligomers of formaldehyde. Copolymers can contain one or more comonomers generally used in preparing polyoxymethylene compositions. Commonly used comonomers include alkylene oxides of 2-12 carbon atoms. If a copolymer is selected, the quantity of comonomer will not be more than 20 weight percent, preferably not more than 15 weight percent, and most preferably about two weight percent. Preferable comonomers are ethylene oxide and butylen oxide, and preferable polyoxymethylene copolymers are copolymers of formaldehyde and ethylene oxide or butylen oxide where the quantity of ethylene oxide or butylen oxide is about two (2) weight percent. It is also preferred that the homo- and copolymers are: 1) those whose terminal hydroxy groups are end-capped by a chemical reaction to form ester or ether groups; or, 2) copolymers that are not completely end-capped, but that have some free hydroxy ends from the comonomer unit. Preferred end groups, in either case, are acetate and methoxy.

Preferred polymers are liquid crystalline polyesters, and it is further preferred that these polyesters be aromatic polyesters. Other substituent groups such as halogen, ether, and aryl may also be present in the LCP. By a LCP is meant a polymer that is anisotropic when tested using the TOT test or any reasonable variation thereof, as described in U.S. Pat. No. 4,118,372. Useful LCPs include poly-esters, poly(esteramides), and poly(ester-imides). One preferred form of LCP is "all aromatic", that is all of the groups in the polymer main chain are aromatic (except for the linking groups such as ester groups), but side groups which are not aromatic may be present.

In a preferred embodiment, the thermoplastic polymer is included in an amount of from about 25 wt % to about 50 wt %, based on the total weight of the composition.

The Thermally Conductive Filler (b)

The thermal conductive filler useful in the invention is not particularly limited so long as it has a thermal conductivity of at least 5 W/mK and preferably at least 10 W/mK. Useful thermally conductive fillers are selected from the group consisting of oxide powders, flakes and fibers composed of aluminum oxide (alumina), zinc oxide, magnesium oxide and silicon dioxide; nitride powders, flakes and fibers composed of boron nitride, aluminum nitride and silicon nitride; metal and metal alloy powders, flakes and fibers composed of gold, silver, aluminum, iron, copper, tin, tin base alloy used as lead-free solder; carbon fiber, graphite flakes or fibers; silicon carbide powder; zinc sulfide, magnesium carbonate and calcium fluoride powder; and the like. For purposes of this description "composed of" generally has the same meaning as "comprising". These fillers may be used independently, or a combination of two or more of them may be used. Preferred thermally conducting fillers are selected from the group consisting of magnesium oxide, graphite flakes or fibers, calcium fluoride powder, magnesium carbonate and zinc sulfide; and especially preferred thermally conducting fillers are calcium fluoride powder, magnesium oxide and magnesium carbonate in terms of electrical insulation that can be an important property required of frame material in this application.

Thermally conductive fillers can have a broad particle size distribution. If the particle diameter of the filler is too small, the viscosity of the resin may increase during blending to the extent that complete dispersion of the filler can not be accomplished. As a result, it may not be possible to obtain resin having high thermal conductivity. If the particle diameter of the filler is too large, it may become impossible to inject the thermally conductive resin into thin portions of the resin injection cavity, especially those associated with heat radiating members. Preferably, the maximum average particle size is less than 300 microns, and more preferably, less than 200 microns; as measured using an AccuSizer Model 780A (Particle Sizing Systems, Santa Barbara, Calif.) by using laser-diffraction type particle diameter distribution with a Selas Granulometer "model 920" or a laser-diffraction scattering method particle diameter distribution measuring device "LS-230" produced by Coulter K.K., for instance. Preferably, the average particle size is between 1 micron to 100 microns, and more preferably, between 5 microns to 60 microns. The particles or granules which have multi-modal size distribution in their particle size can also be used. Especially preferred thermally conductive fillers are calcium fluoride, magnesium carbonate or magnesium oxide having a particle size of from about 1 to about 100 microns and preferably about 5 to about 60 microns.

The surface of the thermally conductive filler, or a filler having a thermal conductivity less than 5 W/mK (as disclosed below), can be processed with a coupling agent, for the purpose of improving the interfacial bonding between the filler surface and the matrix resin. Examples of the coupling agent include silane series, titanate series, zirconate series, aluminate series, and zircoaluminate series coupling agents. Useful coupling agents include metal hydroxides and alkoxides including those of Group IIIa thru VIIIa, Ib, IIb, IIIb, and IVb of the Periodic Table and the lanthanides. Specific coupling agents are metal hydroxides and alkoxides of metals selected from the group consisting of Ti, Zr, Mn, Fe, Co, Ni, Cu, Zn, Al, and B. Preferred metal hydroxides and alkoxides are those of Ti and Zr. Specific metal alkoxide coupling agents are titanate and zirconate orthoesters and chelates including compounds of the formula (I), (II) and (III):

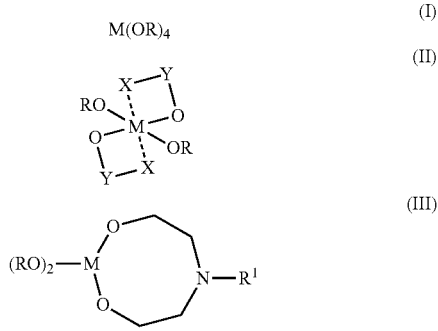

wherein
M is Ti or Zr;
R is a monovalent $C_1$-$C_8$ linear or branched alkyl;
Y is a divalent radical selected from —CH(CH$_3$)—, —C(CH$_3$)=CH$_2$—, or —CH$_2$CH$_2$—;
X is selected from OH, —N(R$^1$)$_2$, —C(O)OR$^3$, —C(O)R$^3$, —CO$_2^-$A$^+$; wherein
R$^1$ is a —CH$_3$ or $C_2$-$C_4$ linear or branched alkyl, optionally substituted with a hydroxyl or interrupted with an ether oxygen; provided that no more than one heteroatom is bonded to any one carbon atom;
R$^3$ is $C_1$-$C_4$ linear or branched alkyl;
A$^+$ is selected from NH$_4^+$, Li$^+$, Na$^+$, or K.

The coupling agent can be added to the filler before mixing the filler with the resin, or can be added while blending the filler with the resin. The additive amount of coupling agent is preferably 0.1 through 5 wt % or preferably 0.5 through 2 wt % with respect to the weight of the filler. Addition of coupling agent during the blending of filler with the resin has the added advantage of improving the adhesiveness between the metal used in the joint surface between the heat transfer unit or heat radiating unit and the thermally conductive resin.

The content of the thermally conductive filler in the thermoplastic composition is in a range of 25 to 85 wt %, and preferably 40 to 70 wt %, where the weight percentages are based on the total weight of the thermoplastic composition.

The Fibrous Filler (c)

The fibrous filler having a thermal conductivity of at most 5 W/mK used as component (c) in the present invention is a needle-like fibrous material. Examples of preferred fibrous fillers include wollastonite (calcium silicate whiskers), glass fibers, glass flakes, aluminum borate fibers, calcium carbonate fibers, and potassium titanate fibers. The fibrous filler will preferably have a weight average aspect ratio of at least 5, or more preferably of at least 10. When used, the optional fibrous filler will preferably be present in about 5 to about 30 weight percent, or more preferably in about 5 to about 20 weight percent, based on the total weight of the composition. Fibrous filler can improve mechanical strength and thermal conductivity in in-plane of mold parts that are important properties required of frame material.

The polymeric toughening agent optionally used in the present invention is any toughening agent that is effective for the thermoplastic polymer used.

When the thermoplastic polymer is a polyester, the toughening agent will typically be an elastomer or has a relatively low melting point, generally <200° C., preferably 150° C. and that has attached to it functional groups that can react with the thermoplastic polyester (and optionally other polymers present). Since thermoplastic polyesters usually have carboxyl and hydroxyl groups present, these functional groups usually can react with carboxyl and/or hydroxyl groups. Examples of such functional groups include epoxy, carboxylic anhydride, hydroxyl(alcohol), carboxyl, and isocyanate. Preferred functional groups are epoxy, and carboxylic anhydride, and epoxy is especially preferred. Such functional groups are usually "attached" to the polymeric toughening agent by grafting small molecules onto an already existing polymer or by copolymerizing a monomer containing the desired functional group when the polymeric tougher molecules are made by copolymerization. As an example of grafting, maleic anhydride may be grafted onto a hydrocarbon rubber using free radical grafting techniques. The resulting grafted polymer has carboxylic anhydride and/or carboxyl groups attached to it. An example of a polymeric toughening agent wherein the functional groups are copolymerized into the polymer is a copolymer of ethylene and a (meth)acrylate monomer containing the appropriate functional group. By (meth)acrylate herein is meant the compound may be either an acrylate, a methacrylate, or a mixture of the two. Useful (meth)acrylate functional compounds include (meth)acrylic acid, 2-hydroxyethyl(meth)acrylate, glycidyl(meth)acrylate, and 2-isocyanatoethyl(meth)acrylate. In addition to ethylene and a functional (meth)acrylate monomer, other monomers may be copolymerized into such a polymer, such as vinyl acetate, unfunctionalized (meth)acrylate esters such as ethyl (meth)acrylate, n-butyl(meth)acrylate, and cyclohexyl (meth)acrylate. Preferred toughening agents include those listed in U.S. Pat. No. 4,753,980. Especially preferred toughening agents are copolymers of ethylene, ethyl acrylate or n-butyl acrylate, and glycidyl methacrylate.

It is preferred that the polymeric toughening agent used with thermoplastic polyesters contain about 0.5 to about 20 weight percent of monomers containing functional groups, preferably about 1.0 to about 15 weight percent, more preferably about 7 to about 13 weight percent of monomers containing functional groups. There may be more than one type of functional monomer present in the polymeric toughening agent. It has been found that toughness of the composition is increased by increasing the amount of polymeric toughening agent and/or the amount of functional groups. However, these amounts should preferably not be increased to the point that the composition may crosslink, especially before the final part shape is attained.

The polymeric toughening agent used with thermoplastic polyesters may also be thermoplastic acrylic polymers that are not copolymers of ethylene. The thermoplastic acrylic polymers are made by polymerizing acrylic acid, acrylate esters (such as methyl acrylate, n-propyl acrylate, isopropyl acrylate, n-butyl acrylate, n-hexyl acrylate, and n-octyl acrylate), methacrylic acid, and methacrylate esters (such as methyl methacrylate, n-propyl methacrylate, isopropyl methacrylate, n-butyl methacrylate (BA), isobutyl methacrylate, n-amyl methacrylate, n-octyl methacrylate, glycidyl methacrylate (GMA) and the like). Copolymers derived from two or more of the forgoing types of monomers may also be used, as well as copolymers made by polymerizing one or more of the forgoing types of monomers with styrene, acryonitrile, butadiene, isoprene, and the like. Part or all of the components in these copolymers should preferably have a glass transition temperature of not higher than 0° C. Preferred monomers for the preparation of a thermoplastic acrylic polymer toughening agent are methyl acrylate, n-propyl acrylate, isopropyl acrylate, n-butyl acrylate, n-hexyl acrylate, and n-octyl acrylate.

It is preferred that a thermoplastic acrylic polymer toughening agent have a core-shell structure. The core-shell structure is one in which the core portion preferably has a glass transition temperature of 0° C. or less, while the shell portion is preferably has a glass transition temperature higher than that of the core portion.

The core portion may be grafted with silicone. The shell section may be grafted with a low surface energy substrate such as silicone, fluorine, and the like. An acrylic polymer with a core-shell structure that has low surface energy substrates grafted to the surface will aggregate with itself during or after mixing with the thermoplastic polyester and other components of the composition of the invention and can be easily uniformly dispersed in the composition.

Suitable toughening agents for polyamides are described in U.S. Pat. No. 4,174,358. Preferred toughening agents include polyolefins modified with a compatibilizing agent such as an acid anhydride, dicarboxylic acid or derivative thereof, carboxylic acid or derivative thereof, and/or an epoxy group. The compatibilizing agent may be introduced by grafting an unsaturated acid anhydride, dicarboxylic acid or derivative thereof, carboxylic acid or derivative thereof, and/or an epoxy group to a polyolefin. The compatibilizing agent may also be introduced while the polyolefin is being made by copolymerizing with monomers containing an unsaturated acid anhydride, dicarboxylic acid or derivative thereof, carboxylic acid or derivative thereof, and/or an epoxy group. The compatibilizing agent preferably contains from 3 to 20 carbon atoms. Examples of typical compounds that may be grafted to (or used as comonomers to make) a polyolefin are acrylic acid, methacrylic acid, maleic acid, fumaric acid, itaconic acid, crotonic acid, citrconic acid, maleic anhydride, itaconic anhydride, crotonic anhydride and citraconic anhydride.

Preferred toughening agents for polyacetals include thermoplastic polyurethanes, polyester polyether elastomers, other functionalized and/or grafted rubber, and polyolefins that contain polar groups that are either grafted to their backbones or were incorporated by copolymerizing with a monomer that contained one or more polar groups. Preferable comonomers are those that contain epoxide groups, such as glycidyl methacrylate. A preferred toughening agent is EBAGMA (a terpolymer derived from ethylene, butyl acrylate, and glycidyl methacrylate).

When used, the optional polymeric toughening agent will preferably be present in about 2 to about 15 weight percent, or more preferably in about 5 to about 15 weight percent, based on the total weight of the composition.

The compositions of this invention may optionally include one or more plasticizers that are suitable for the thermoplastic polymer used. Examples of suitable plasticizers for thermoplastic polyesters are include poly(ethylene glycol) 400 bis (2-ethyl hexanoate), methoxypoly(ethylene glycol) 550 (2-ethyl hexanoate), and tetra(ethylene glycol) bis(2-ethyl hexanoate), and the like. When used, the plasticizer will preferably be present in about 0.5 to about 5 weight percent, based on the total weight of the composition.

When the thermoplastic polymer used in the composition of this invention is a polyester, the composition may also optionally include one or more nucleating agents such as a sodium or potassium salt of a carboxylated organic polymer, the sodium salt of a long chain fatty acid, sodium benzoate, and the like. Part or all of the polyester may be replaced with a polyester having end groups, at least some of which have been neutralized with sodium or potassium. When used, the nucleating agent will preferably be present in about 0.1 to about 4 weight percent, based on the total weight of the composition.

Flame retardancy is an important requirement of the frame material in electric and electronics appliance. So, the composition of the present invention may also optionally include one or more flame retardants. Examples of suitable flame retardants include, but are not limited to brominated polystyrene, polymers of brominated styrenes, brominated epoxy compounds, brominated polycarbonates, poly(pentabromobenzyl acrylate) and metal phosphinates. When used, the flame retardant will preferably be present in about 3 to about 20 weight percent, based on the total weight of the composition. Compositions comprising flame retardants may further comprise one or more flame retardant synergists such as, but not limited to, sodium antimonate and antimony oxide.

The thermoplastic resin composition of this invention may also optionally include, in addition to the above components, additives such as heat stabilizers, antioxidants, dyes, pigments, mold release agents, lubricants, UV stabilizers, (paint) adhesion promoters, and the like. When used, the foregoing additives will in combination preferably be present in about 0.1 to about 5 weight percent, based on the total weight of the composition.

The compositions of the present invention are in the form of a melt-mixed blend, wherein all of the polymeric components are well-dispersed within each other and all of the non-polymeric ingredients are homogeneously dispersed in and bound by the polymer matrix, such that the blend forms a unified whole. The blend may be obtained by combining the component materials using any melt-mixing method. The component materials may be mixed to homogeneity using a melt-mixer such as a single or twin-screw extruder, blender, kneader, Banbury mixer, etc. to give a resin composition. Part of the materials may be mixed in a melt-mixer, and the rest of the materials may then be added and further melt-mixed until homogeneous. The sequence of mixing in the manufacture of the thermally conductive polymer resin composition of this invention may be such that individual components may be melted in one shot, or the filler and/or other components may be fed from a side feeder, and the like, as will be understood by those skilled in the art.

The composition of the present invention may be formed into articles using methods known to those skilled in the art, such as, for example, injection molding, blow molding, or extrusion. Such articles can include those for use in motor housings, lamp housings, lamp housings in automobiles and other vehicles, and electrical and electronic housings. Examples of lamp housings in automobiles and other vehicles are front and rear lights, including headlights, tail lights, and brake lights, particularly those that use light-emitting diode (LED) lamps. The articles may serve as replacements for articles made from aluminum or other metals in many applications.

EXAMPLES

Compounding and Molding Method: The polymeric compositions shown in Table 1 were prepared by compounding in 32 mm Werner and Pfleiderer twin screw extruder. All ingredients were blended together and added to the rear (barrel 1) of the extruder except that thermally conductive fillers and fibrous fillers were side-fed into barrel 5 (of 10 barrels). Barrel temperatures were set at about 345° C. for LCP polymer compositions and about 315° C. for HTN compositions resulting in melt temperatures of about 350 and 330° C., respectively.

The compositions were molded into ISO test specimens on an injection molding machine for the measurement of mechanical properties, thermal conductivity and volume resistivity. For flaming test, they were molded into bars with a thickness of 1/16 inch (1.6 mm). Melt temperature were about 350° C. and mold temperatures were about 100° for LCP compositions and melt temperature of about 320° C. and mold temperature of 150° C. for HTN compositions.

Testing methods: Thermal conductivity was determined on gate side area of the ISO bar with a thickness of 4 mm at 23° C. using Laser Flash Method as described in ASTM E1461. Results are shown in Table 1. A thermal conductivity of at least 0.6 W/m'K is deemed to be acceptable.

Melt viscosity (MV) was measured using a Kayeness rheometer. The melt viscosities of the LCP based pellets and HTN based ones were measured at a shear rate of 1200/second and at a temperature of 340° C. and 325° C. respectively after a residence time of 5 min and 10 min, respectively, in each example.

Volume resistivity was measured according to JIS K6911. The results are shown in Table 1.

Tensile strength was determined using ISO 527-1/2.
Flexural modulus was determined using ISO 178.
Notched Charpy impact resistance was determined using ISO 179/1eA.

Melt viscosity was determined using a Kayeness melt rheometer at 1000 cm-1 and the temperatures shown in Table 1.

The following terms are used in Table 1:
LCP: Zenite® 5000, a liquid crystalline polymer manufactured by E.I. du Pont de Nemours and Co., Wilmington, Del.
HTN: Zytel® HTN501, a polyamide6TDT manufactured by E.I. du Pont de Nemours and Co., Wilmington, Del.
2,6-NDA: 2,6-naphthalenedicarboxylic acid, manufactured by BP Amoco Chemical Company.
CaF2: Calcium fluoride is powder which has 30 micron meter average particle size manufactured by Sankyo Seifun, Japan. Thermal conductivity of calcium fluoride is 10 W/mK.
f-SiO2: FB940, a spherical silica manufactured by Denki Kagaku Kogyo K.K. The average size of the FB940 was about 14 μm. Thermal conductivity of fused silica is 1 W/mK.
MgO: Coolfiller® CF2-100A magnesium oxide supplied by Tateho Chemical Industries Co., Ltd. The average size of the Coolfiller® magnesium oxide was about 25 μm. Thermal conductivity of magnesium oxide is 42 W/mK
Graphite: CB-150, graphite powder which has 40 micron meter average particle size supplied by Nippon Graphite Industries, Ltd. Thermal conductivity of graphite is from 80 to 230 W/mK.
GF: Glass fibers, Vetrotex® 910, supplied by OCV Co. Thermal conductivity of glass is 1 W/mK.
Rubber-1: An ethylene/n-butyl acrylate/glycidyl methacrylate terpolymer made from 66.75 weight percent ethylene, 28 weight percent n-butyl acrylate, and 5.25 weight percent glycidyl methacrylate. It has a melt index of 12 g/10 minutes as measured by ASTM method D1238.
Rubber-2: TRX 301, an ethylene/propylene/hexadiene terpolymer grafted with 2.1% maleic anhydride, was purchased from Dow Chemical (Midland, Mich., USA).
AO-80: A hindered phenol based antioxidant: (Asahi Denka Co.)
Ultranox 626A: Bis(2,4-di-tert-butylphenyl pentaerythritol) diphosphite.
Talc: LMS#200 supplied from Maruo Calcium Co., ltd.
PED521: a lubricant supplied from Clariant Japan.K.K.

TABLE 1

| | | | example-1 | example-4 | example-2 | example-3 | example-5 | Comp. Ex-1 | example-6 | example-7 |
|---|---|---|---|---|---|---|---|---|---|---|
| Formulation | LCP | wt. % | 32.7 | 28.4 | 29.6 | 23.6 | 57 | 22.7 | | |
| | HTN | | | | | | | | 43.2 | 42.2 |
| | 2,6-NDA | | 0.8 | 0.6 | 0.8 | 0.6 | | 0.3 | 0.2 | 0.2 |
| | CaF2 | | 60.5 | 71 | | | | | 46 | 54 |
| | f-SiO2 | | | | | | | 77 | | |
| | MgO-1 | | | | 64.2 | 75.8 | | | | |
| | MgO-2 | | | | | | | | | |
| | Gpahite | | | | | | 40 | | | |
| | GF | | 6 | | 5.4 | | | | 7 | |
| | Rubber-1 | | 0 | | | | 3 | | | |
| | Rubber-2 | | | | | | | | 2.4 | 2.4 |
| | AO-80 | | | | | | | | 0.4 | 0.4 |
| | Ultranox 626 | | | | | | | | 0.2 | 0.2 |
| | PED521 | | | | | | | | 0.2 | 0.2 |
| | Talc | | | | | | | | 0.4 | 0.4 |

TABLE 1-continued

| Property | | | example-1 | example-4 | example-2 | example-3 | example-5 | Comp. Ex-1 | example-6 | example-7 |
|---|---|---|---|---|---|---|---|---|---|---|
| Property | Thermal conductivity | W/mK | 0.8 | 1 | 1.1 | 1.5 | 0.7 | 0.5 | 0.6 | 0.6 |
| | Tensile strength | MPa | 60 | 42 | 48 | 33 | 83 | 39 | 106 | 78 |
| | Tensile elonfation | % | 2.6 | 1.8 | 2.5 | 2.4 | 2.3 | 0.5 | 2.5 | 2.2 |
| | Flexural strength | MPa | 104 | 86 | 96 | 69 | 114 | 68 | 157 | 145 |
| | Flexural Modulus | GPa | 12 | 10.5 | 11.3 | 9.6 | 13.9 | 13.1 | 6.9 | 5.9 |
| | N-Charpy Impact | kJ/m2 | 3.9 | 3.2 | 3.8 | 2.5 | 5.8 | 1.5 | 4.1 | 3.8 |
| | Flammability | Class | V-0 | V-0 | V-1 | V-1 | HB | V-0 | HB | HB |
| | Volume Resistivity | ohm | $>10^{14}$ | $>10^{14}$ | $>10^{14}$ | $>10^{14}$ | $<10^{9}$ | $>10^{14}$ | $>10^{14}$ | $>10^{14}$ |
| | Melt viscosity | Pa·s | 130 | 125 | 84 | 139 | 126 | 260 | 213 | 249 |

What is claimed is:

1. A composition comprising liquid crystalline polymer, in an amount between about 15 and about 75 weight percent of the composition; thermally conductive filler having a thermal conductivity of at least 5 W/mK, in an amount between about 25 and about 85 weight percent of the composition, wherein said thermally conductive filler is at least one selected from the group consisting of calcium fluoride, magnesium oxide, magnesium carbonate, boehmite and zinc sulfide, wherein the thermally conductive filler has an average particle size between 1 micron and 100 microns; and at least one fibrous filler having a thermal conductivity of at most 5 W/mK, in an amount between about 5 and about 30 weight percent of the composition, wherein the fibrous filler comprises wollastonite, glass fibers, glass flakes, aluminum borate fibers, calcium carbonate fibers, or potassium titanate fibers, further wherein said composition has a volume resistivity that is larger than $1 \times 10^{10}$ ohm·cm.

2. The composition of claim 1, wherein said fibrous filler is a glass fiber.

3. The composition of claim 2, wherein said composition has a flexural modulus that is larger than 10 Gpa.

4. The composition of claim 1, having a flame retardancy that can be classified as V-0 at 1.6 mm thickness according to the UL94 flaming test.

5. The composition of claim 1, wherein said composition has a flame retardancy that can be classified as V-0 at 1.6 mm thickness in the UL94 flaming test.

6. The composition of claim 1, wherein said liquid crystalline polymer comprises an aromatic polyester.

7. The composition of claim 1, wherein said liquid crystalline polymer is present in an amount between about 25 and about 50 weight percent of the composition.

8. The composition of claim 1, wherein said thermally conductive filler has a thermal conductivity of at least 10 W/mK.

9. The composition of claim 1, wherein said thermally conductive filler is present in an amount between about 40 and about 70 weight percent of the composition.

10. The composition of claim 1, wherein said thermal conductivity of said at least one fibrous filler is about 1 W/mk to at most 5 W/mK.

11. The composition of claim 1, wherein said composition comprises 5 to 30 weight percent of the at least one fibrous filler.

12. The composition of claim 1, wherein said at least one fibrous filler has a weight average aspect ratio of at least 5.

13. The composition of claim 1, further comprising a polymeric toughening agent.

14. The composition of claim 13, wherein said polymeric toughening agent comprises a terpolymer derived from ethylene, butyl acrylate, and glycidyl methacrylate.

15. The composition of claim 13, where said polymeric toughening agent is present in an amount between about 2 and about 15 weight percent of the composition.

* * * * *